US011162995B2

United States Patent
Hayashida

(10) Patent No.: US 11,162,995 B2
(45) Date of Patent: Nov. 2, 2021

(54) FAILURE ANALYZING APPARATUS AND FAILURE ANALYZING METHOD

(71) Applicant: Toshiba Memory Corporation, Minato-ku (JP)

(72) Inventor: Yukinobu Hayashida, Kawasaki (JP)

(73) Assignee: Toshiba Memory Corporation, Minato-ku (JP)

(*) Notice: Subject to any disclaimer, the term of this patent is extended or adjusted under 35 U.S.C. 154(b) by 486 days.

(21) Appl. No.: 16/042,337

(22) Filed: Jul. 23, 2018

(65) Prior Publication Data
US 2019/0285686 A1    Sep. 19, 2019

(30) Foreign Application Priority Data
Mar. 15, 2018 (JP) .............................. JP2018-047878

(51) Int. Cl.
*G01R 31/26*    (2020.01)
*G11C 29/00*    (2006.01)
*G11C 29/56*    (2006.01)

(52) U.S. Cl.
CPC ............ *G01R 31/26* (2013.01); *G11C 29/006* (2013.01); *G11C 29/56004* (2013.01); *G11C 29/56008* (2013.01); *G11C 2029/5604* (2013.01)

(58) Field of Classification Search
CPC .............. G01R 31/31703; G01R 31/26; G11C 29/56004; G11C 29/56008; G11C 29/006; G11C 2029/5604
See application file for complete search history.

(56) References Cited

U.S. PATENT DOCUMENTS

| | | | | |
|---|---|---|---|---|
| 5,966,459 A | * | 10/1999 | Chen | ........................ G06K 9/00 |
| | | | | 348/126 |
| 6,016,278 A | * | 1/2000 | Tsutsui | .................... H01L 22/20 |
| | | | | 257/E21.525 |
| 6,185,511 B1 | * | 2/2001 | Steffan | ..................... G06K 9/00 |
| | | | | 257/E21.525 |
| 7,071,833 B2 | | 7/2006 | Nagano et al. | |

(Continued)

FOREIGN PATENT DOCUMENTS

| JP | 2000-260844 | 9/2000 |
|---|---|---|
| JP | 4347751 | 10/2009 |
| JP | 2011-187836 | 9/2011 |

*Primary Examiner* — Yoshihisa Ishizuka
(74) *Attorney, Agent, or Firm* — Oblon, McClelland, Maier & Neustadt, L.L.P.

(57) ABSTRACT

According to one embodiment, an arithmetic processor generates unknown code distribution information, for an unknown test code to which no failure mode has been specified, and determines whether labeling of the unknown code distribution information is performable. The arithmetic processor determines whether the unknown code distribution information agrees to known code distribution information, when labeling of the unknown code distribution information is performable. The arithmetic processor determines whether the unknown code satisfies a classification minimum requirement of the agreed known code. The arithmetic processor presents a content of EFA measurement that assumes a failure mode corresponding to the known code, when the unknown code distribution information agrees to the known code distribution information, and the unknown code satisfies the classification minimum requirement of the known code.

20 Claims, 12 Drawing Sheets

(56) References Cited

U.S. PATENT DOCUMENTS

| | | | |
|---|---|---|---|
| 7,404,110 B1* | 7/2008 | Johnson | G06F 11/263 |
| | | | 714/700 |
| 2003/0061212 A1* | 3/2003 | Smith | G06Q 10/06 |
| 2017/0018314 A1* | 1/2017 | Chae | G11C 29/4401 |
| 2017/0053712 A1* | 2/2017 | Kim | G11C 29/56004 |

* cited by examiner

FIG.3

| FAILURE MODE ↓ | CORRESPONDENCE TABLE OF FAILURE MODE TO TEST CODE | | | | | DETERMINATION PRIORITY ORDER |
|---|---|---|---|---|---|---|
| | TEST 1 | TEST 2 | TEST 3 | ⋯ | TEST N | |
| FAILURE MODE A | D/C | 1 | D/C | ⋯ | D/C | ↓ |
| FAILURE MODE B | 0 | 0 | 1 | ⋯ | D/C | |
| FAILURE MODE C | 1 | D/C | D/C | ⋯ | D/C | |
| ⋮ | ⋮ | ⋮ | ⋮ | ⋮ | ⋮ | |
| FAILURE MODE Z | D/C | D/C | D/C | ⋯ | 1 | |

FIG.4

| [No] | [PRODUCT] | [FAILURE MODE] | [ID] | [WAFER LABEL] | [IN-WAFER DISTRIBUTION] | [CHIP LABEL] | [IN-CHIP THREE-DIMENSIONAL DISTRIBUTION] |
|---|---|---|---|---|---|---|---|
| 1 | PRODUCT A | FAILURE MODE A | ** | WAFER LABEL A | (IN-WAFER DISTRIBUTION MODEL A) | CHIP LABEL A | (IN-CHIP THREE-DIMENSIONAL DISTRIBUTION MODEL A) |
| 2 | PRODUCT B | FAILURE MODE B | ** | WAFER LABEL B | (IN-WAFER DISTRIBUTION MODEL B) | CHIP LABEL B | (IN-CHIP THREE-DIMENSIONAL DISTRIBUTION MODEL B) |
| 3 | PRODUCT C | FAILURE MODE C | ** | WAFER LABEL C | (IN-WAFER DISTRIBUTION MODEL C) | CHIP LABEL C | (IN-CHIP THREE-DIMENSIONAL DISTRIBUTION MODEL C) |
| .. | .. | .. | .. | .. | .. | .. | .. |

FIG.5

| [No] | [PRODUCT] | [TEST CODE] | [FAILURE MODE] | [ID] | [WAFER LABEL] | [IN-WAFER DISTRIBUTION] | [CHIP LABEL] | [IN-CHIP THREE-DIMENSIONAL DISTRIBUTION] |
|---|---|---|---|---|---|---|---|---|
| 1 | PRODUCT D | 100000··· | Unknown | ** | WAFER LABEL D | (IN-WAFER DISTRIBUTION MODEL D) | CHIP LABEL D | (IN-CHIP THREE-DIMENSIONAL DISTRIBUTION MODEL D) |
| 2 | PRODUCT E | 100001··· | Unknown | ** | WAFER LABEL E | (IN-WAFER DISTRIBUTION MODEL E) | CHIP LABEL E | (IN-CHIP THREE-DIMENSIONAL DISTRIBUTION MODEL E) |
| 3 | PRODUCT F | 100011··· | FAILURE MODE F? | ** | WAFER LABEL F | (IN-WAFER DISTRIBUTION MODEL F) | CHIP LABEL F | (IN-CHIP THREE-DIMENSIONAL DISTRIBUTION MODEL F) |
| ·· | | | | | | | | |

FIG.7

| [No] | [PRODUCT] | [COMBINED ID] | [WAFER LABEL] | [IN-WAFER DISTRIBUTION] | [CHIP LABEL] | [IN-CHIP THREE-DIMENSIONAL DISTRIBUTION] | [NUMBER IN COMBINATION] (NUMBER OF DIMENSIONS IN COMBINATION) |
|---|---|---|---|---|---|---|---|
| 1 | PRODUCT G | ID_***+ID_** | WAFER LABEL D | (IN-WAFER DISTRIBUTION MODEL D) | CHIP LABEL D | (IN-CHIP THREE-DIMENSIONAL DISTRIBUTION MODEL D) | 2 |
| 2 | PRODUCT H | ID_***+ID_** | WAFER LABEL E | (IN-WAFER DISTRIBUTION MODEL E) | CHIP LABEL E | (IN-CHIP THREE-DIMENSIONAL DISTRIBUTION MODEL E) | 2 |
| 3 | PRODUCT I | ID_***+ID_***+ID_** | WAFER LABEL F | (IN-WAFER DISTRIBUTION MODEL F) | CHIP LABEL F | (IN-CHIP THREE-DIMENSIONAL DISTRIBUTION MODEL F) | 3 |
| : | : | : | : | : | : | : | : |

※ALL COMBINATIONS ARE DESCRIBED

FIG.8

| [CLASSIFICATION MINIMUM REQUIREMENT FAILURE MODE NAME] | [CLASSIFICATION MINIMUM REQUIREMENT TEST CODE] | [KNOWN CODE PATTERN LABEL] | [EFA SEQUENCE] |
|---|---|---|---|
| FAILURE MODE A | 1***** ···* | WAFER LABEL D | EFA SEQUENCE A |
| FAILURE MODE B | 11* ···* | WAFER LABEL E | EFA SEQUENCE B |
| FAILURE MODE C | 10* ···* | WAFER LABEL F | EFA SEQUENCE C |
| ⋮ | ⋮ | ⋮ | ⋮ |

※ALL COMBINATIONS ARE DESCRIBED

FIG.9

| [EFA SEQUENCE] | [EFA CONTENT] |
|---|---|
| EFA SEQUENCE A | EFA_A→EFA_B→EFA_F→EFA_H |
| EFA SEQUENCE B | EFA_A |
| EFA SEQUENCE C | EFA_A→EFA_B→EFA_G |
| : | |

FAILURE ANALYZING APPARATUS AND FAILURE ANALYZING METHOD

CROSS-REFERENCE TO RELATED APPLICATIONS

This application is based upon and claims the benefit of priority from Japanese Patent Application No. 2018-047878, filed on Mar. 15, 2018; the entire contents of which are incorporated herein by reference.

FIELD

An embodiment described herein relates generally to a failure analyzing apparatus and a failure analyzing method.

BACKGROUND

In failure analysis for semiconductor memories, failure modes are classified, on the basis of test codes and bit line/word line error statuses. The test codes are formed by combining acceptability results of respective tests performed to each semiconductor memory. Semiconductor memories, which are treated as analysis objects, have come to have a three-dimensional structure. Thus, there has been an increase in unclassified test codes that cannot be used for failure mode classification in the conventional failure analysis.

BRIEF DESCRIPTION OF THE DRAWINGS

FIG. 3 is a diagram illustrating an example of failure mode specifying information;

FIG. 4 is a diagram illustrating an example of known code pattern label information;

FIG. 5 is a diagram illustrating an example of test code pattern label information;

FIG. 7 is a diagram illustrating an example of combined test code pattern label information;

FIG. 6 is a diagram illustrating an example of classification minimum requirement information;

FIG. 9 is a diagram illustrating an example of EFA sequence information; and

DETAILED DESCRIPTION

In general, according to one embodiment, a failure analyzing apparatus includes an arithmetic processor. The arithmetic processor compares a test code obtained by executing a plurality of electric tests different in type on a wafer, with a known code indicating a status of acceptability results of the electric tests, which is correlated with a known failure mode. The electric tests is executed in units of a region in a chip of a wafer, which is smaller than the chip, and the chip including a semiconductor memory with memory cells arranged in a three-dimensional state. The arithmetic processor specifies a failure mode corresponding to the test code. The arithmetic processor generates unknown code distribution information that includes in-wafer and in-chip three-dimensional distributions, for an unknown test code to which no failure mode has been specified (which will be referred to as "unknown code", hereinafter). The arithmetic processor determines whether labeling of the unknown code distribution information is performable to the unknown code. The arithmetic processor determines whether the unknown code distribution information agrees to known code distribution information, when labeling of the unknown code distribution information is performable. The known code distribution information includes in-wafer and in-chip three-dimensional distributions for the known code. The arithmetic processor determines whether the unknown code satisfies a classification minimum requirement of the agreed known code. And the arithmetic processor presents a content of EFA measurement that assumes a failure mode corresponding to the known code, when the unknown code distribution information agrees to the known code distribution information, and the unknown code satisfies the classification minimum requirement of the known code.

An exemplary embodiment of a failure analyzing apparatus and a failure analyzing method will be explained below in detail with reference to the accompanying drawings. The present invention is not limited to the following embodiment.

Figure 1:
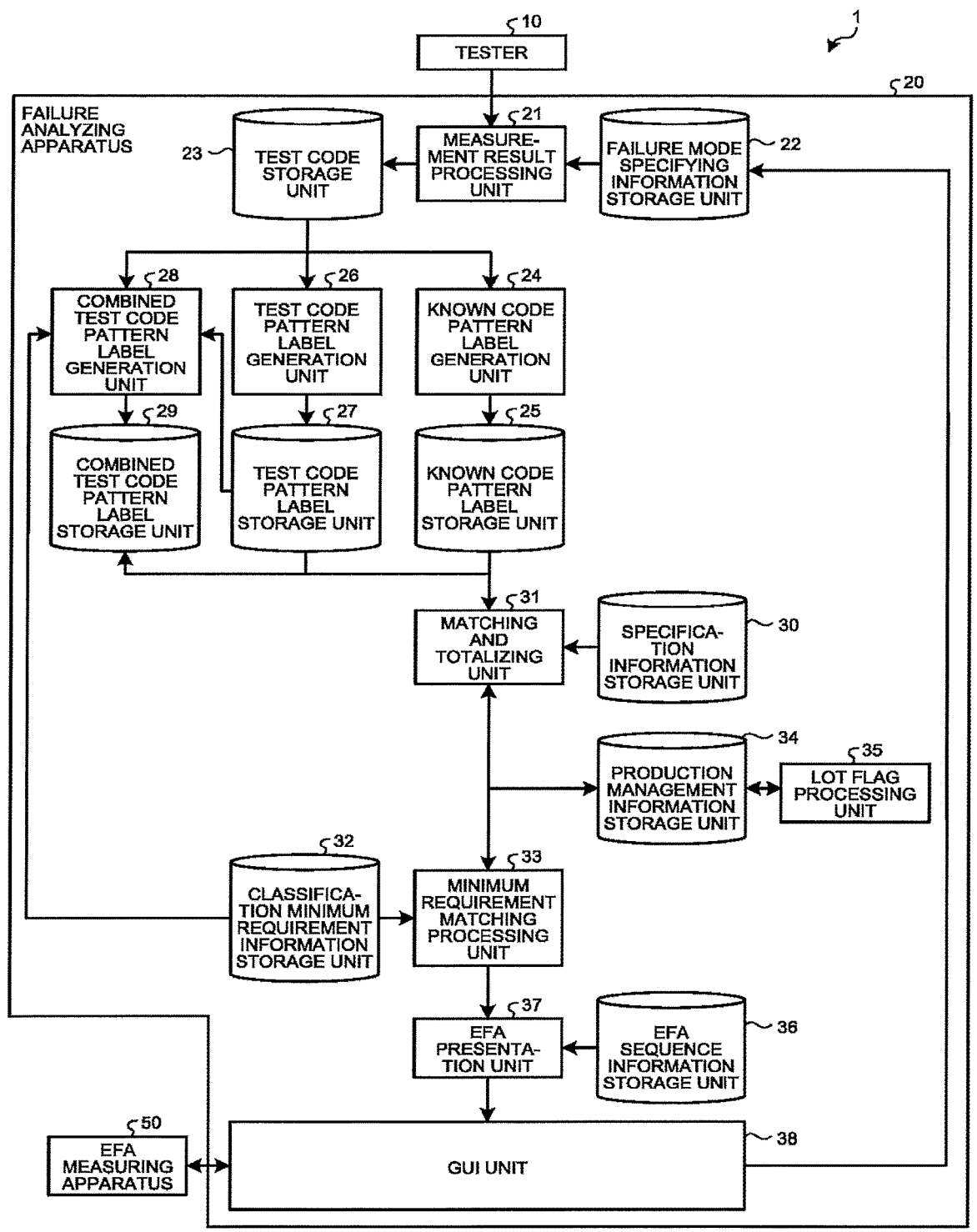
FIG. 1 is a block diagram schematically illustrating a functional configuration example of a failure analyzing system including a failure analyzing apparatus according to an embodiment.

FIG. 1 is a block diagram schematically illustrating a functional configuration example of a failure analyzing system including a failure analyzing apparatus according to an embodiment. The failure analyzing system 1 includes a tester 10, a failure analyzing apparatus 20, and an Electric Failure Analysis (EFA) measuring apparatus 50.

Figure 2A:
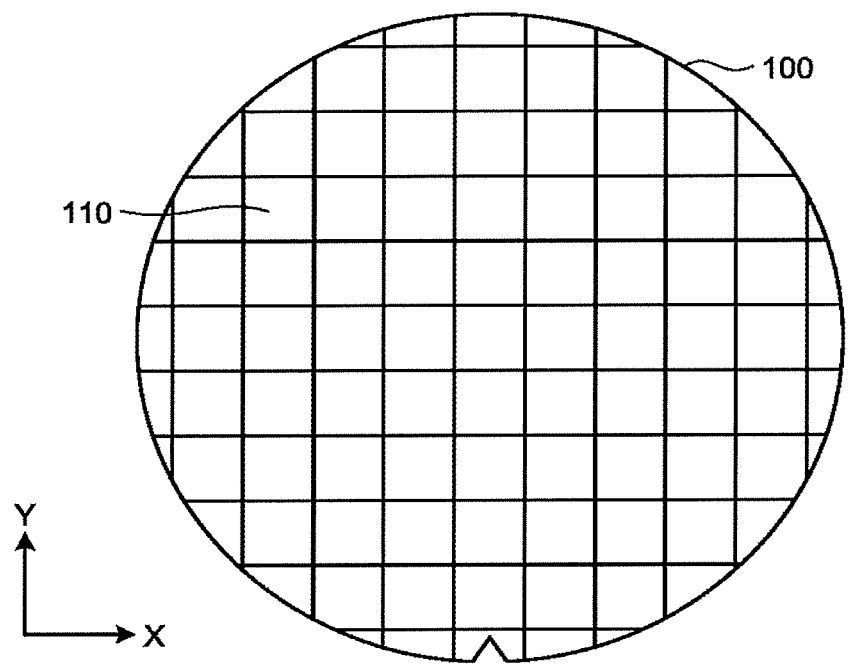
FIGS. 2A and 2B are diagrams illustrating an example of a unit to be subjected to an electric test performed on a wafer.
Figure 2B:
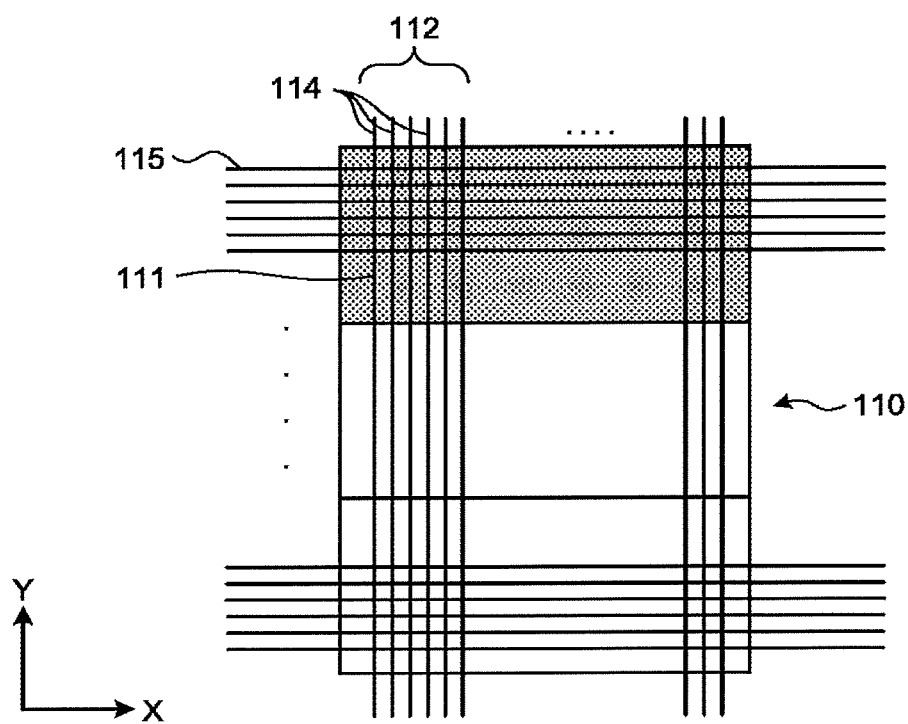

The tester 10 is a measuring apparatus performing an electric test to a semiconductor memory. FIGS. 2A and 2E are diagrams illustrating an example of a unit to be subjected to an electric test performed on a wafer. FIG. 2A is a diagram illustrating a wafer, and FIG. 2B is a diagram illustrating a chip. As illustrated in FIG. 2A, a plurality of rectangular chips 110 are formed in the wafer 100, and each chip has a size smaller than that of the wafer 100. Each chip 110 is, for example, a memory chip, which is formed by integrating a memory, a circuit for driving the memory, and so forth.

As illustrated in FIG. 2B, the chip 110 includes a plurality of blocks 111 arrayed in a two-dimensional state, and each block has a size smaller than that of the chip 110. In the case where the semiconductor memory is a NAND type flash memory, the block 111 serves as a unit for erasing. The block 111 includes a plurality of memory cells. Where an X-axis and a Y-axis perpendicular to each other are set in the chip 110, bit lines 114 are provided to mutually connect blocks 111 arrayed in the Y-direction, and word lines 115 are provided in the K-direction. A column (which will be referred to as "CL", hereinafter) 112 is formed by bundling a predetermined number of bit lines 114. CLs 112 are arranged in parallel with each other in the X-axis direction.

The tester 10 performs electric tests for the CLs 112 and the blocks 111 of each chip 110. Further, even in the case where the semiconductor memory is a NAND type flash memory having a three-dimensional structure, electric tests are performed in the same way. The electric tests for the CLs 112 and the blocks 111 are arranged to confirm whether the semiconductor memory will operate normally. As the electric tests, a plurality of tests have been prepared, so as to specify a cause in case of the presence of a failure. The tester 10 outputs each measurement result as a test code to the failure analyzing apparatus 20.

The failure analyzing apparatus 20 analyzes each test code acquired from the tester 10, and presents an EFA content and a sample to be treated as an EFA object, which are used for performing classification into a known failure mode or registration of a new failure mode. When a test code has been unavailable for performing classification into a known failure mode or registration of a new failure mode, the test code is saved as an unknown code. This will be described later in detail.

The EFA measuring apparatus 50 performs EFA measurement to the sample presented by the failure analyzing apparatus 20, in accordance with the EFA content presented by the failure analyzing apparatus 20. The EFA measuring apparatus 50 outputs the EFA measurement result to the failure analyzing apparatus 20.

The failure analyzing apparatus 20 includes a measurement result processing unit 21, a failure mode specifying information storage unit 22, a test code storage unit 23, a known code pattern label generation unit. 24, a known code pattern label storage unit 25, a test code pattern label generation unit 26, a test code pattern label storage unit 27, a combined test code pattern label generation unit 28, a combined test code pattern label storage unit 29, a specification information storage unit 30, a matching and totalizing unit 31, a classification minimum requirement information storage unit 32, a minimum requirement matching processing unit 33, a production management information storage unit 34, a lot flag processing unit 35, an EFA sequence information storage unit 36, an EFA presentation unit 37, and a GUI unit 38.

The measurement result processing unit 21 performs failure mode classification, on the basis of test codes acquired from the tester 10 and bit line/word line error statuses, and saves an unknown code in units of the block or in units of the CL, on which the failure mode classification has been unavailable, together with test codes for the entire wafer, into the test code storage unit 23. Specifically, for each test code in units of the block or in units of the CL, which has acceptability result information about the test, among the acquired test codes, the measurement result processing unit 21 specifies a failure mode, with reference to failure mode specifying information in the failure mode specifying information storage unit 22. Along the measurement results, the measurement result processing unit 21 stores each test code in units of the block or in units of the CL, to which no failure mode has been specified, into the test code storage unit 23, as an unknown code. The bit line/word line error status is an error status given, for example, in the case where the same test fails continuously at adjacent bit lines, and thus indicates failure continuity.

The failure mode specifying information storage unit 22 stores failure mode specifying information. The failure mode specifying information is information for specifying a failure mode from a measurement result. This failure mode specifying information is composed of test codes owned by failure modes already specified. FIG. 3 is a diagram illustrating an example of the failure mode specifying information. The failure mode specifying information is information in which electric test results at each block 111 or CL 112 are correlated with a failure mode. FIG. 3 illustrates a case where electric test results at each CL 112 are correlated with a failure mode. Here, test codes are correlated with failure modes in accordance with a determination priority order. For example, a case is assumed where the test 1 has failed (1), the test 2 has passed (0), the test 3 has failed (1), . . . , and the test N has failed (1). In this case, when their correspondence is checked in order from the failure mode A, correspondence matching appears at the failure mode C for the first time, and thus this case is specified as the failure mode C.

The test code storage unit 23 stores test codes in units of the block or in units of the CL. Of the measured test codes, the test codes include a test code, to which no failure mode has been specified, (which will be referred to as "unknown code", hereinafter), and a test code corresponding to a failure mode stored in the failure mode specifying information storage unit 22, (which will be referred to as "known code", hereinafter). Accordingly, the test code storage unit 23 includes an unknown code storage area that stores unknown codes in units of the block or in units of the CL, of the measurement results, and a known code storage area that stores known codes in units of the block or in units of the CL.

The known code pattern label generation unit 24 generates an in-wafer distribution and an in-chip three-dimensional distribution, which are correlated with each known code (failure mode) acquired from the known code storage area of the test code storage unit 23. The in-wafer distribution is the distribution of chips 110 including a known code, to which a failure mode has been specified, in a wafer 100. The in-chip three-dimensional distribution is the three-dimensional distribution of blocks 111 or CLs 112 including a known code in a chip 110. The known code pattern label generation unit 24 attaches a known code pattern label to each of the in-wafer distribution and the in-chip three-dimensional distribution thus generated. For example, a wafer label is attached to each in-wafer distribution, and a chip label is attached to each in-chip three-dimensional distribution, such that a combination of the wafer label with the chip label serves as a known code pattern label. The known code pattern label generation unit 24 attaches a known code pattern label to each set of an in-wafer distribution and an in-chip three-dimensional distribution, and saves the result into the known code pattern label storage unit 25.

The known code pattern label storage unit 25 stores known code pattern label information that indicates sets of an in-wafer distribution and an in-chip three-dimensional distribution with a known code pattern label attached thereto. FIG. 4 is a diagram illustrating an example of the known code pattern label information. The known code pattern label information contains, for each record, information on product, failure mode, identification information (ID), wafer label, in-wafer distribution, chip label, and it-chip three-dimensional distribution. The product provides information, such as a product model number or a product group in which planned design or preliminary processing is in common. The failure mode provides a test code having a failure cause obvious or a test code having a failure cause specified by experience or the like, where the test code has been summarized to be easy to understand, in accordance with the failure form. For example, the failure mode includes a two-line continuous word line failure, a single bit line open failure, or the like. The identification information (ID) is information for identifying a combination of a wafer label and a chip label. The wafer label is a label attached to an in-wafer distribution, and the chip label is a label attached to an in-chip three-dimensional distribution. Each of the in-wafer distribution and the in-chip three-dimensional distribution has been obtained by the known code pattern label generation unit 24.

For each unknown code in the unknown code storage area of the test code storage unit 23, the test code pattern label generation unit 26 generates an in-wafer distribution and an in-chip three-dimensional distribution, attaches a test code pattern label to these distributions, and saves the result into the test code pattern label storage unit 27. In attachment of a label, when no regularity is present in either of the in-wafer distribution and in-chip three-dimensional distribution of an unknown code, a predetermined label indicating that this is random (unclassified) is attached. Further, when some regularity is present in the in-wafer distribution and/or the in-chip three-dimensional distribution, for example, a wafer label and/or a chip label other than the predetermined label indicating randomness are attached. For determination of the presence or absence of regularity, for example, there is a method of performing determination in consideration of whether the distribution status of failed portions is unbalanced.

The test code pattern label storage unit 27 stores test code pattern label information that indicates an in-wafer distribution and an in-chip three-dimensional distribution for each unknown code with a test code pattern label attached thereto. FIG. 5 is a diagram illustrating an example of the test code pattern label information. The test code pattern label information contains, for each record, information on product, test code, failure mode, identification information (ID), wafer label, in-wafer distribution, chip label, and in-chip three-dimensional distribution. The product provides information, such as a product model number or a product group in which planned design or preliminary processing is in common. The test code is an unknown code in units of the block or in units of the CL. The failure mode is the same as that described above, but is expressed by "unknown" here as the mode cannot be specified (the mode does not match the failure mode specifying information of FIG. 3). Each distribution can be turned into an image by visualization conversion, if the distribution is held as a model file made by modularizing data. It may be arranged to hold image data itself already visualized. Until EFA measurement is performed, a failure cause with high probability is input. After EFA measurement is performed and a failure cause is specified, the failure cause is input as the cause of an unknown code, and thus failure mode classification is achieved. Here, each failure mode column is empty immediately after being stored by the test code pattern label Generation unit 26, and then a probable failure mode is input into this column by the matching and totalizing unit 31 as described later. The identification information (ID) is information for identifying a combination of a wafer label and a chip label. The wafer label is a label attached to an in-wafer distribution, and the chip label is a label attached to an in-chip three-dimensional distribution. Each of the in-wafer distribution and the in-chip three-dimensional distribution has been obtained by the test code pattern label generation unit 26.

For unknown codes classified in "random" in the test code pattern label storage unit 27, the combined test code pattern label generation unit 28 combines some of the unknown codes to generate an in-wafer distribution and an in-chip three-dimensional distribution. The combined test code pattern label generation unit 28 attaches a combined test code pattern label to a combination of unknown codes, which composes the in-wafer distribution and in-chip, three-dimensional distribution thus generated, and saves the result into the combined test code pattern label storage unit 29.

Figure 6:
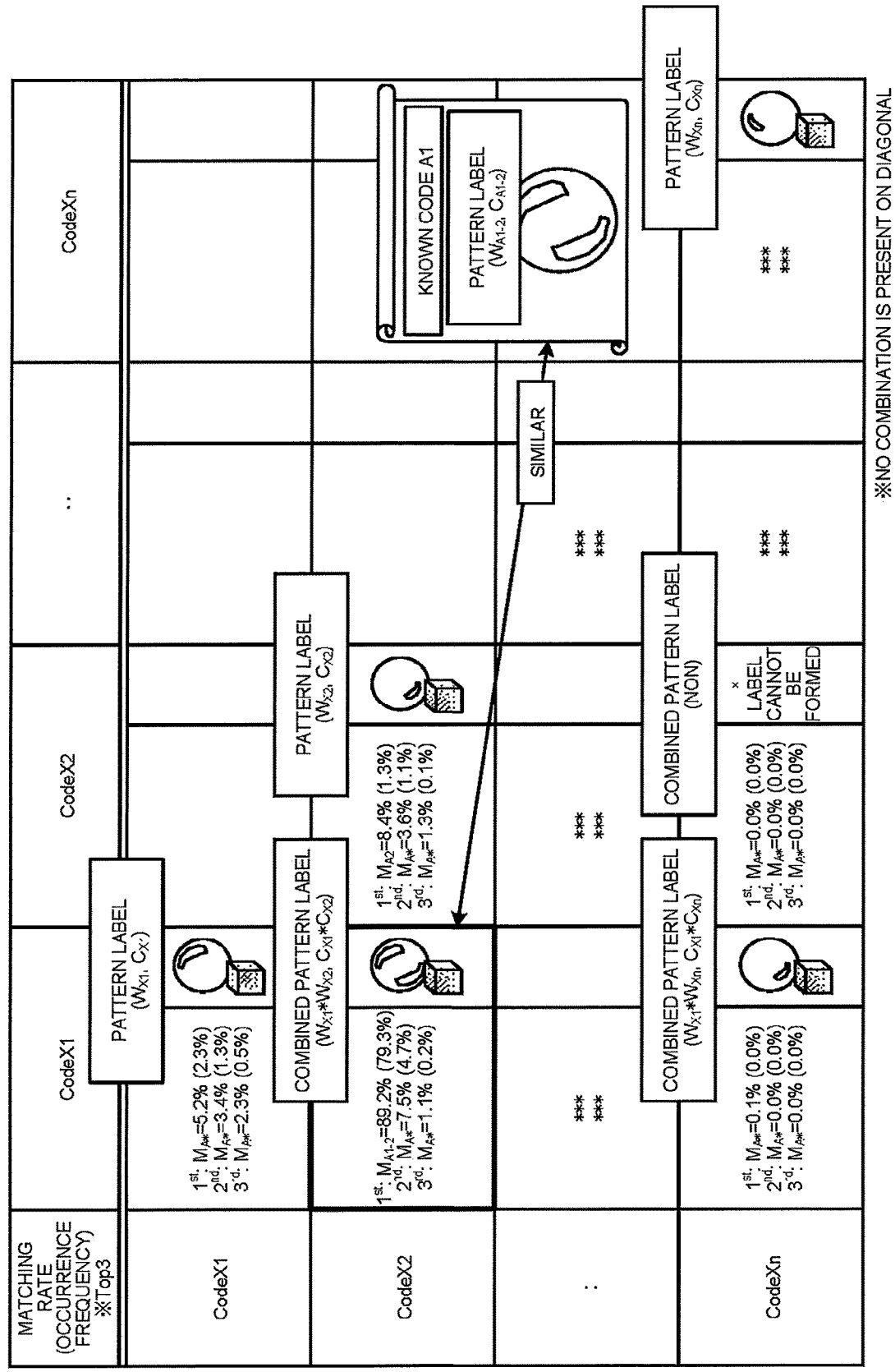
FIG. 6 is a diagram illustrating the scheme of generation of a combined test code pattern label.

Specifically, when unknown codes classified in "random" satisfy a classification minimum requirement (for example, a requirement to fail or pass only a specific test in a test code of the failure mode specifying information of FIG. 3), all the unknown codes having this classification minimum requirement are listed, and all the combinations derived from these unknown codes are stacked in a time direction. FIG. 6 is a diagram illustrating the scheme of generation of a combined test code pattern label. When unknown codes classified in "random" satisfy a classification minimum requirement A, all the unknown codes are listed on the basis of the classification minimum requirement A. Here, it is assumed that codes X1 to Xn are listed. As illustrated in FIG. 6, for the codes X1 to Xn thus listed, a combined stack map is created and is formed into a label. The stack map is made by mutually stacking the in-wafer distributions and in-chip three-dimensional distributions of the respective unknown codes. However, this stacking is not performed for unknown codes that are the same as each other, because it is meaningless. FIG. 6 illustrates a case where two codes are combined (as a result where the stacking is not performed for unknown codes that are the same as each other, because of the above reason); however, when three or more codes are combined, it suffices by increasing the dimensions.

For example, in the case of the code X1 including a wafer label $W_{X1}$ and a chip label $C_{X1}$, this code includes an in-wafer distribution and an in-chip three-dimensional distribution as illustrated in FIG. 6, and its pattern label becomes ($W_{X1}$, $C_{X1}$). In the case of a combination of the code X1 with a code X2 including a wafer label $W_{X2}$ and a chip label $C_{X2}$, this combination includes an in-wafer distribution and an in-chip three-dimensional distribution as illustrated in FIG. 6, and its pattern label becomes ($W_{X1}*W_{X2}$, $C_{X1}*C_{X2}$) In the case of a combination of the code X2 with a code Xn including a wafer label $W_{Xn}$ and a chip label $C_{Xn}$, this combination includes an in-wafer distribution and an in-chip three-dimensional distribution as illustrated in FIG. 6, and its combined pattern label is not present. Hereinafter, a combination of a plurality of unknown codes will be referred as "combined unknown code".

When a combined unknown code has come to have regularity, labeling is performed to this code, and this result is transferred to the matching and totalizing unit 31. On the other hand, when a combined unknown code has no regularity, the combined test code pattern label generation unit 28 gives "no unknown code label" to the corresponding unknown code record in the test code storage unit 23.

The combined test code pattern label storage unit 29 stores combined test code pattern label information that indicates an in-wafer distribution and an in-chip three-dimensional distribution for each combined unknown code with a combined test code pattern label attached thereto.

FIG. 7 is a diagram illustrating an example of the combined test code pattern label information. The combined test code pattern label information contains information on product, combined identification information (combined ID), identification information (ID), wafer label, in-wafer distribution, chip label, in-chip three-dimensional distribution, and number in combination. The product provides information, such as a product model number or a product group in which planned design or preliminary processing is in common. The combined identification information (combined ID) is identification information indicating unknown codes composing each combined unknown code, for which identification information in the test code pattern label storage unit 27 is used. The identification information (ID) is information for identifying each combined unknown code. The wafer label is a label attached to an in-wafer distribution, and the chip label is a label attached to an in-chip three-dimensional distribution. Each of the in-wafer distribution and the in-chip three-dimensional distribution has been obtained by the combined test code pattern label generation unit 28. The number in combination provides information indicating the number of unknown codes composing each combined unknown code registered.

The specification information storage unit 30 stores specification information that indicates the upper limit threshold of a matching rate to perform saving of a combined unknown code. The specification information is used when the matching and totalizing unit 31 performs matching processing for a combined unknown code label.

For each unknown code label stored in the test code pattern label storage unit 27 other than those in "random", the matching and totalizing unit 31 determines whether its in-wafer distribution and in-chip three-dimensional distribution agree to the in-wafer distribution and in-chip three-dimensional distribution of a known code stored in the known code pattern label storage unit 25.

Specifically, the matching and totalizing unit 31 compares each unknown code label other than those in "random", with known code pattern labels, to perform matching. As a result of the matching, the matching and totalizing unit 31 picks out a known code pattern label highest in matching rate. On the other hand, for an object wafer with an unknown code that has not agreed to any known code pattern in relation to the in-wafer distribution and the in-chip three-dimensional distribution, the matching and totalizing unit 31 attaches an unknown code label to the wafer, and saves the result.

Further, for each combined unknown code label stored in the combined test code pattern label storage unit 29, the matching and totalizing unit 31 determines whether its in-wafer distribution and in-chip three-dimensional distribution agree to the in-wafer distribution and in-chip three-dimensional distribution of a known code label. When the distribution, agree to each other, the matching and totalizing unit 31 determines whether the matching rate satisfies the specification information in the specification information storage unit 30. When a combined unknown code label has not agreed to any known code label in relation to the in-wafer distribution and the in-chip three-dimensional distribution, has not satisfied the specification information, the matching and totalizing unit 31 attaches a combined unknown code label to the object wafer, and saves the result into the test code pattern label storage unit 27.

Specifically, the matching and totalizing unit 31 compares each combined unknown code label with known code pattern labels, to perform matching. As a result of the matching, the matching and totalizing unit 31 picks out a combined unknown code label highest in matching rate, and a known code pattern label similar to this unknown code label. For example, as illustrated in FIG. 6, calculation is performed to the matching rate of the in-wafer distribution and in-chip three-dimensional distribution of each combined unknown code label with the in-wafer distribution and in-chip three-dimensional distribution of a known code label. Then, a combined unknown code label highest in matching rate among the calculated matching rates is acquired. Thereafter, the matching and totalizing unit 31 determines whether the matching rate is higher than the specification information in the specification information storage unit 30. When the matching rate is lower than the specification information, the tested wafer is less relevant to the in-wafer distribution and in-chip three-dimensional distribution of the combined unknown code label, and thus is not suitable for EFA. Accordingly, in order to exclude such a less relevant wafer, determination is performed by using the specification information.

Here, the matching rate may be calculated by using any optional method. For example, in FIG. 6, the matching rate is given by an overlap ratio of labels, using a known code label as a reference, which is calculated by using the following formula (1), where "k" is a coefficient; however, the formula (1) is a mere example. The matching rate may be calculated by another method, such as calculation of similarity between in-plane distributions.

$$\text{Matching rate } M = \text{"Wafer region where combined unknown code label overlaps known code label"/"Wafer region of known code label} \times k \times \text{Chip region where combined unknown code label overlaps known code label"/"Chip region of known code label"} \quad (1)$$

The classification minimum requirement information storage unit 32 stores classification minimum requirement information that contains a classification minimum requirement for each known mode to satisfy. FIG. 8 is a diagram illustrating an example of the classification minimum requirement information. The classification minimum requirement information contains, for each record, information on classification minimum requirement failure mode name, classification minimum requirement test code, known code pattern label, and EFA sequence. The classification minimum requirement failure mode name provides identification information for specifying a classification minimum requirement, and is not present in the test code of the failure mode specifying information of FIG. 3. This failure mode name is decided by designating the acceptability result of a test selected within a test code without depending on the determination order. The classification minimum requirement test code is a test code for the classification minimum requirement to satisfy. For example, the classification minimum requirement test code is a test code in units of the block or in units of the CL. The classification minimum requirement test code is formed of an array of a plurality of test results, in which, for example, "1" indicates that the test result is failing, and "*" indicates that the test result can accept either of failing and passing. The known code pattern label provides an in-wafer distribution and an in-chip three-dimensional distribution correlated with a known mode. The EFA sequence provides identification information that associates the classification minimum requirement information with a minimum requirement-dependent EFA sequence defined by the EFA sequence information storage unit 36 as described later.

With reference to the classification minimum requirement information storage unit 32, the minimum requirement matching processing unit 33 determines whether each unknown code or combined unknown code satisfies the classification minimum requirement of a known code pattern label. When an unknown code or combined unknown code satisfies the classification minimum requirement of a known code pattern label, a wafer having this unknown code is treated as an EFA measurement object. Accordingly, the minimum requirement matching processing unit 33 acquires the EFA sequence corresponding to the known code label from the classification minimum requirement information storage unit 32, and transfers the EFA sequence to the EFA presentation unit 37.

When the matching rate of the combined unknown code label is higher than the specification information, a wafer having the combined unknown code label is treated as an EFA measurement object. Accordingly, the minimum requirement matching processing unit 33 acquires the EFA sequence correlated with the similar classification minimum requirement test code from the classification minimum requirement information storage unit 32, and transfers the EFA sequence to the EFA presentation unit 37.

The production management information storage unit 34 stores production management information for managing the production status of each wafer 100 in a production system that performs production to the wafer 100. For example, the production management information contains identification information attached to the wafer 100, identification information for identifying the lot to which the wafer 100 belongs, the position of the wafer 100 inside the production system, and an EFA execution flag indicating the presence or absence of EFA execution. With the production management information, when the identification information of the wafer 100 is specified, an associated lot is identified so that the location of the lot composed of wafers 100 the same as the tested wafer 100 can be confirmed.

When it is determined by the minimum requirement matching processing unit 33 that a wafer having an unknown code label or a wafer having a combined unknown code label is an EFA measurement object, the lot flag processing unit 35 attaches an EFA execution flag to the object test lot in the production management information in the production management information storage unit 34. Further, the lot flag processing unit 35 has a real time monitoring unit function to monitor an EFA object pattern label and it occurrence frequency, so that, when the test step involves no lot to be subjected to EFA, the lot flag processing unit 35 can mainly catch a wafer to be treated as the next object.

The EFA sequence information storage unit 36 stores EFA sequence information that defines the EFA content, for an EFA sequence treated as an object. FIG. 9 is a diagram illustrating an example of the EFA sequence information. The EFA sequence information contains, for each record, information on EFA sequence and EFA content. The EFA sequence provides identification information for identifying the EFA content, and is associated with the classification minimum requirement information described above. The EFA content defines the content of EFA to be performed in each EFA sequence.

The EFA presentation unit 37 acquires the EFA content corresponding to an EFA sequence, which has been received from the minimum requirement matching process unit 33, from the EFA sequence information storage unit 36, and presents the EFA, content to the GUI unit 38. Further, with reference to the production management information in the production management information storage unit 34, the EFA presentation unit 37 acquires a sample suitable for EFA measurement, and presents the sample to the GUI unit 38. As the sample suitable for EFA measurement, for example, a sample with an EFA execution flag attached thereto is acquired.

The GUI unit 38 serves as a user interface in the failure analyzing apparatus 20, and is configured to display, on a display device, information concerning an operation of the failure analyzing apparatus 20, or a failure analysis result, or to receive an instruction from a user. Here, the GUI unit 38 displays a totalization result from the matching and totalizing unit 31, on the display device. Further, the GUI unit 38 displays, on the display device, an EFA content and an EFA measurement object obtained from the EFA presentation unit 37, and receives an instruction for executing EFA measurement from a user. Further, the GUI unit 38 displays a measurement result obtained in the EFA measuring apparatus 50, and performs, on the basis of this result, registration of a new mode and/or update of a known code, with respect to a known code pattern label or combined pattern label assumed by the matching and totalizing unit 31.

Figure 10A:
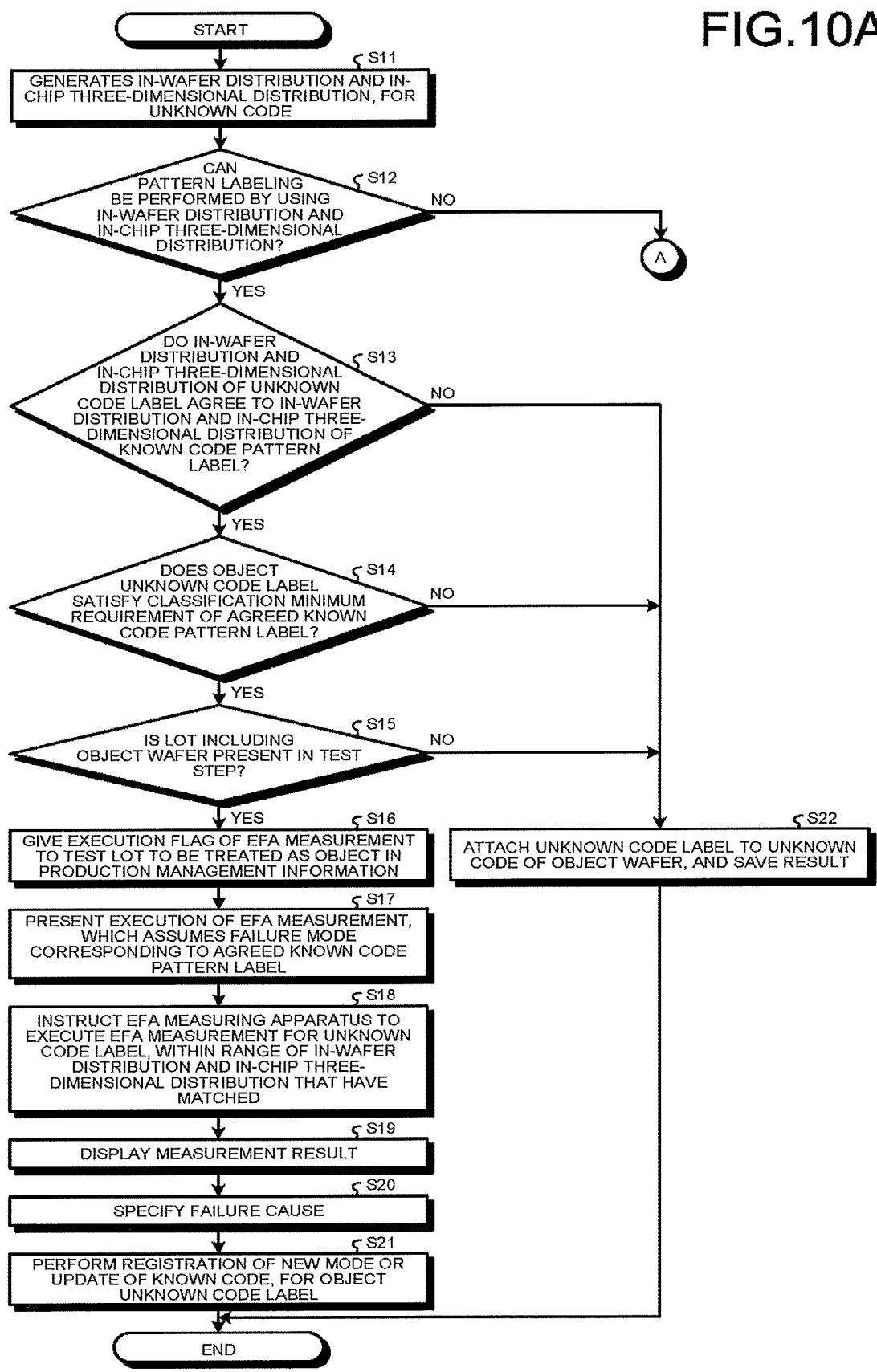
FIGS. 10A and 10B are a flowchart illustrating an example of the sequence of a failure analyzing method according to the embodiment.
Figure 10B:
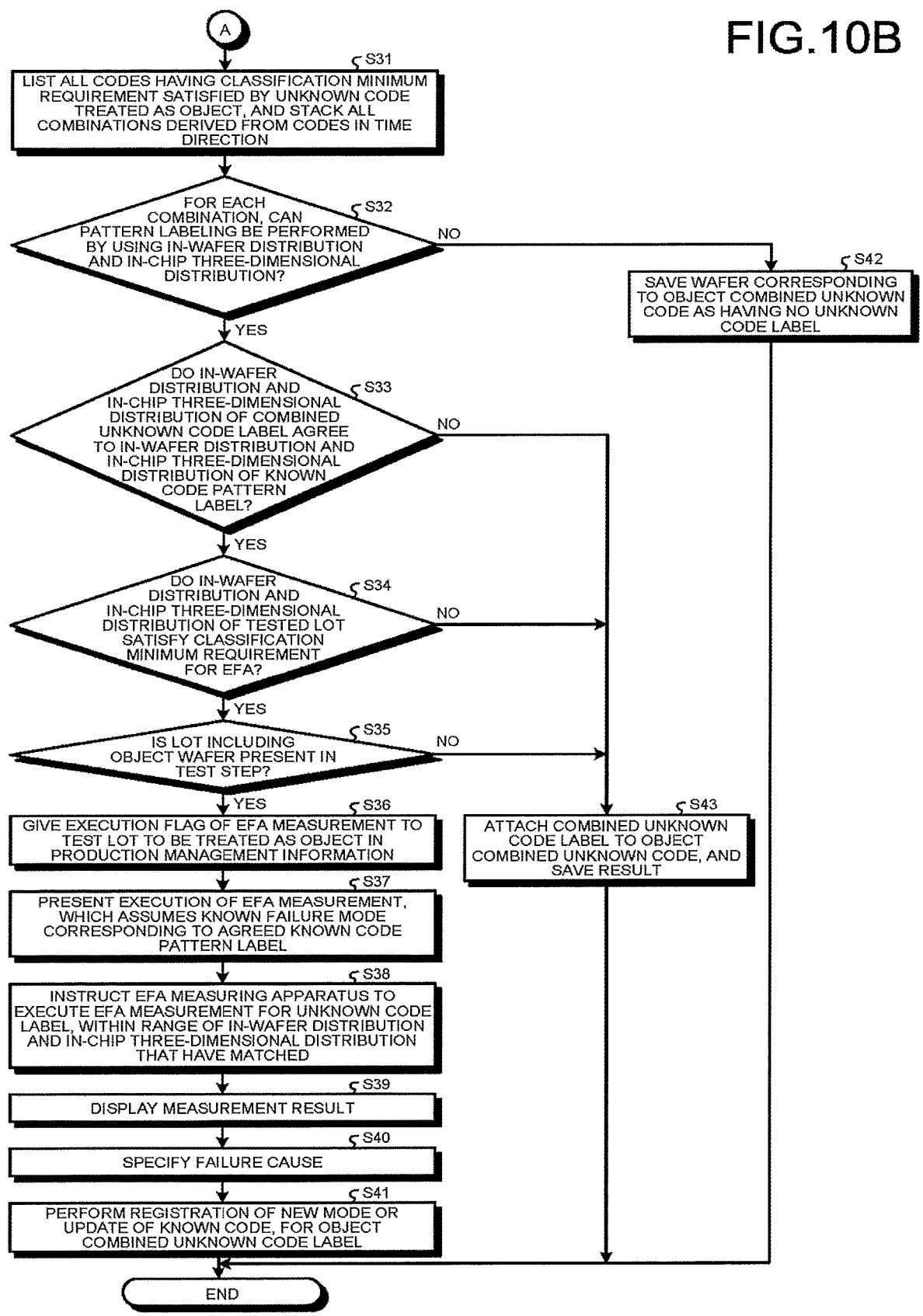

Next, an explanation will be given of a failure analyzing method in the failure analyzing apparatus 20. FIGS. 10A and 10B are a flowchart illustrating an example of the sequence of a failure analyzing method according to the embodiment. Here, an explanation will be given of processing in the case where test codes output from the tester 10 are subjected to determination whether a matching code is present in the failure mode specifying information, and the test codes are found to include an unknown code that does not match the failure mode specifying information. Further, it is assumed that, for each known code included in the failure mode specifying information, a known code pattern label has been generated by the known code pattern label generation unit 24, and stored in the known code pattern label storage unit 25.

First, the test code pattern label generation unit 26 generates an in-wafer distribution and an in-chip three-dimensional distribution, for each unknown code stored in the test code storage unit 23 (step S11). Then, the test code pattern label generation unit 26 determines whether pattern labeling can be performed by using the in-wafer distribution and the in-chip three-dimensional distribution (step S12). Specifically, the object unknown code is subjected to determination whether the in-wafer distribution and the in-chip three-dimensional distribution are at random. When the in-wafer distribution and the in-chip three-dimensional distribution are at random, it is determined that the pattern labeling cannot be performed.

When the pattern labeling can be performed (Yes at step S12), the matching and totalizing unit 31 determines whether the in-wafer distribution and in-chip three-dimensional distribution of the object unknown code label agree to the in-wafer distribution and in-chip three-dimensional distribution of a known code pattern label in the known code pattern label storage unit 25 (step S13). For example, when the matching rate of the in-wafer distribution and in-chip three-dimensional distribution of the object unknown code label with the in-wafer distribution and in-chip three-dimensional distribution of a certain known code pattern label is equal to or higher than a predetermined value, it is determined that these distributions agree to each other.

When the distributions agree to each other (Yes at step S13), the minimum requirement matching processing unit 33 determines whether the object unknown code label satisfies the classification minimum requirement of the agreed known code pattern label (step S14). When the object unknown code label satisfies the classification minimum requirement (Yes at step S14), the minimum requirement matching processing unit 33 acquires the EFA sequence corresponding to the known code, from the classification minimum requirement information in the classification minimum requirement information storage unit 32, and transfers the EFA sequence to the EFA presentation unit 37. Further, with reference to the production management information, the lot flag processing unit 35 determines whether a lot including the object wafer 100 is present in the test step (step S15). When a lot including the object wafer 100 is present in the test step (Yes at step S15), the lot flag processing unit 35 gives an execution flag of EFA measurement to the record of a test lot to be treated as an object in the production management information (step S16).

Thereafter, the EFA presentation unit 37 acquires the EFA content corresponding to the acquired EFA sequence, from the EFA sequence information storage unit 36, and presents execution of EFA measurement, which assumes the failure mode corresponding to the agreed known code pattern label, to the GUI unit 38 (step S17).

Thereafter, when an instruction for executing the presented EFA measurement is given by a user, the GUI unit 36 instructs the EFA measuring apparatus 50 to execute the EFA measurement for the unknown code label, within the range of the in-wafer distribution and in-chip three-dimensional distribution that have matched (step S18). In the EFA measuring apparatus 50, for example, when the unknown code label is a test code for the blocks 111, chips 110 in the wafer 100, which have the same in-wafer distribution and in-chip three-dimensional distribution, are selected, and the EFA measurement for the unknown code is executed to blocks 111 within this range. Further, in the EFA measuring apparatus 50, for example, when the unknown code label is a test code for the CLs 112, chips 110 in the wafer 100, which nave the same in-wafer distribution and in-chip three-dimensional distribution, are selected, and the EFA measurement for the unknown code label is executed to CLs 112 within this range.

After the EFA measurement is executed in the EFA measuring apparatus 50, the measurement result is output to the GUI unit 38, and the GUI unit 38 displays the measurement result on a display unit (not illustrated) (step S19). Thereafter, a failure cause is specified by the user with reference to the measurement result (step S20). Then, in accordance with the specified failure cause, registration of a new mode or update of a known code is performed for the object unknown code label (step 21). As a result, the processing sequence ends.

On the other hand, when the distributions do not agree to each other in step S13 (No at step S13), when the object unknown code label does not satisfy the classification minimum requirement in step S14 (No at step S14), or when a lot including the object wafer 100 is not present in the test step in step S15 (No at step S15), the matching and totalizing unit 31 attaches an unknown code label to the unknown code of the object wafer 100, and saves the result into the test code pattern label storage unit 27 (step S22). Then, the processing sequence ends.

In step S22, when it is determined that the pattern labeling cannot be performed (No at step S12), the combined test code pattern label generation unit 28 lists all the codes having a classification minimum requirement satisfied by the unknown code treated as an object, and stacks all the combinations derived from these codes in a time direction (step S31). Then, for each combination, the combined test code pattern label generation unit 28 determines whether pattern labeling can be performed by using the in-wafer distribution and the in-chip three-dimensional distribution (step S32).

When the pattern labeling can be performed at step S32), the matching and totalizing unit 31 determines whether the in-wafer distribution and in-chip three-dimensional distribution of the object combined unknown code label agree to the in-wafer distribution and in-chip three-dimensional distribution of a known code pattern label (step S33).

When the distributions agree to each other (Yes at step S33), the matching and totalizing unit 31 determines whether the in-wafer distribution and in-chip three-dimensional distribution of the tested lot satisfy a classification minimum requirement to execute EFA (step 334). Here, it is determined whether the matching rate is higher than the specification information stored in the specification information storage unit 30.

When the classification minimum requirement execute EFA is satisfied (Yes at step S34), the lot flag processing unit 35 determines whether a lot including the object wafer 100 is present in the test step, with reference to the production management information (step S35). When a lot including the object wafer 100 is present in the test step (Yes at step S35), the lot flag processing unit 35 gives an execution flag of EFA measurement to a test lot to be treated as an object in the production management information (step S36).

Thereafter, the EFA presentation unit 37 acquires the EFA content, by using the known code that has agreed to the combined unknown code, the classification minimum requirement information in the classification minimum requirement information storage unit 32, and the EFA sequence information in the EFA sequence information storage unit 36. Then, the EFA presentation unit 37 presents execution of EFA measurement, which assumes the known failure mode corresponding to the agreed known code pattern label, to the GUI unit 39 (step S37). Consequently, selection of the optimum sample for executing EFA can be monitored in real time.

Thereafter, when an instruction for executing the presented EFA measurement is given by the user, the GUI unit 36 instructs the EFA measuring apparatus 50 to execute the presented EFA measurement for the unknown code label, within the range of the in-wafer distribution and in-chip three-dimensional distribution that have matched (step S38).

After the EFA measurement is executed in the EFA measuring apparatus 50, the measurement result is output to the GUI unit 38, and the GUI unit 38 displays the measurement result on the display unit (not illustrated) (step S39). Thereafter, a failure cause is specified by the user with reference to the measurement result (step S40). Then, in accordance with the specified failure cause, registration of a new mode or update of a known code is performed for the object combined unknown code label (step S11). As a result, the processing sequence ends.

On the other hand, in step S32, when it is determined that the pattern labeling cannot be performed (No at step S32), the matching and totalizing unit 31 saves the wafer 100 corresponding to the object combined unknown code into the test code storage unit 23, as having no unknown code label (step S42). Then, the processing sequence ends.

When the distributions do not agree to each other in step S33 (No at step S33), when the classification minimum requirement to execute EFA measurement is not satisfied in step S34 (No at step S34), or when a lot including the object wafer 100 is not present in the test step in step S35 (No at step S35), a combined unknown code label is attached to the object combined unknown code in the combined test code pattern label storage unit 29, and the result is saved (step S43). Then, the processing sequence ends.

By executing the processing illustrated in FIGS. 10A and 10B, unknown codes and known codes (failure modes) stored in the test code storage unit 23 are compared with each other, to monitor the presence or absence of relevance.

Figure 11:
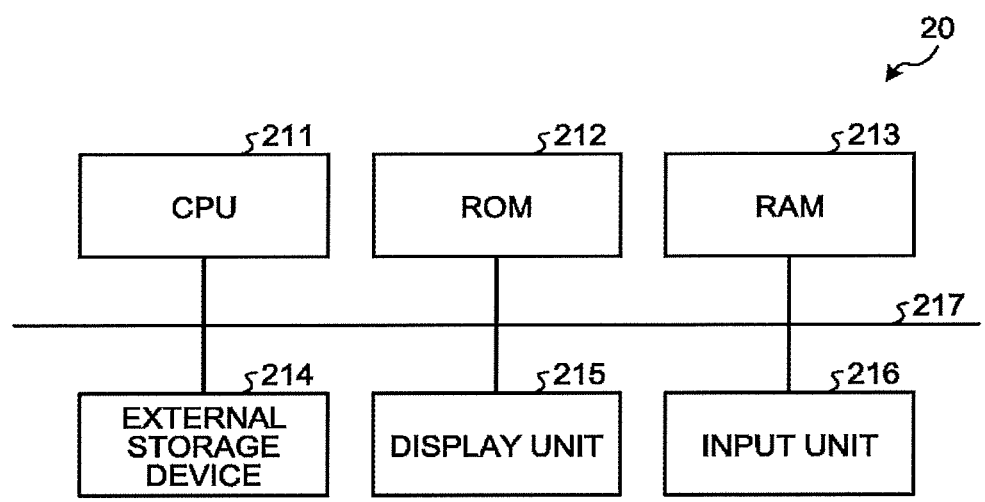
FIG. 11 is a block diagram illustrating a hardware configuration example of the failure analyzing apparatus.

Next, an explanation will be given of the hardware configuration of the failure analyzing apparatus 20 according to the embodiment. FIG. 11 is a block diagram illustrating a hardware configuration example of the failure analyzing apparatus. The failure analyzing apparatus 20 according to this embodiment has a hardware configuration utilizing an ordinary computer, in which a Central Processing Unit (CPU) 211, a Read Only Memory (ROM) 212, a Random Access Memory (RAM) 213 serving as the main storage device, an external storage device 214, such as a Hard Disk Drive (HDD) or Compact Disc (CD) drive device, a display unit 215, such as a display device, and an input unit 216, such as a keyboard and/or a mouse, are included, and are connected to each other via a bus line 217.

A program to be executed by the failure analyzing apparatus 20 according to this embodiment has been prepared to perform the method illustrated in FIGS. 10A and 10B. This program is provided in a state recorded in a computer-readable recording medium, such as a CD-ROM, flexible disk (FD), CD-R (Recordable), or Digital Versatile Disk (DVD), by a file in an installable format or executable format.

Alternatively, a program to be executed by the failure analyzing apparatus 20 according to this embodiment may be provided such that the program is stored in a computer connected to a network, such as the internet, and is downloaded via the network. Further, a program to be executed by the failure analyzing apparatus 20 according to this embodiment may be provided such that the program is provided or distributed via a network, such as the internet.

Alternatively, a program according to this embodiment may be provided in a state incorporated in an ROM or the like in advance.

A program to be executed by the failure analyzing apparatus 20 according to this embodiment is formed in a module configuration that contains the respective units scribed above (the measurement result processing unit 21, known code pattern label generation unit 24, test code pattern label generation unit 26, combined test code pattern label generation unit 28, matching and totalizing unit 31, minimum requirement matching processing unit 33, lot flag processing unit 35, EFA presentation unit 37, and GUI unit 38). For actual hardware, the CPU (processor) reads the program from a storage medium, such as one described above, and executes the program to load the respective units described above into the main storage device. Consequently, the measurement result processing unit 21, known code pattern label generation unit 24, test code pattern label generation unit 26, combined test code pattern label generation unit 28, matching and totalizing unit 31, minimum requirement matching processing unit 33, lot flag processing unit 35, EFA presentation unit 37, and GUI unit 38 are generated in the main storage device.

In this embodiment, when the in-wafer distribution and in-chip three-dimensional distribution of an unknown code label in units of the block or in units of the CL agree to the in-wafer distribution and in-chip three-dimensional distribution of a known code, it is determined whether the unknown code label satisfies the classification minimum requirement of the agreed known code label. When the unknown code label satisfies the classification minimum requirement of the agreed known code label, the EFA sequence correlated with the agreed known code label is presented. In accordance with a result of execution of the presented EFA sequence, the unknown code label is classified into the failure mode correlated with the known code, or is saved while an unknown code label is attached thereto.

Further, for an unknown code in units of the block or in units of the CL, when its in-wafer distribution and in-chip three-dimensional distribution are at random, and thus pattern labeling cannot be performed, all the test codes having a classification minimum requirement satisfied by the unknown code are listed, and all the combinations derived from these test codes are stacked in a time direction. When the in-wafer distribution and in-chip three-dimensional distribution of a combined unknown codes label thus stacked agree to the in-wafer distribution and in-chip three-dimensional distribution of a known code label, the EFA sequence correlated with the agreed known code label is presented. In accordance with a result of execution of the presented EFA sequence, the unknown code is classified into the failure mode correlated with the known code label, or is saved while a combined unknown code label is attached thereto.

Consequently, an unknown code in units of the block or in units of the CL can be classified into a failure mode, and thus the number of unknown codes that cannot be classified into failure modes can be reduced. As a result, an effect is obtained that can improve the failure mode classification accuracy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A failure analyzing system comprising:
    a tester performing an electric test on semiconductor memories and to output each of measurement results as respective test codes;
    a failure analyzing apparatus to receive the test codes from the tester;
    an electric failure analysis (EFA) apparatus receiving EFA content from the failure analyzing apparatus and outputting an EFA measurement result to the failure analyzing apparatus;
    the failure analyzing apparatus comprising an arithmetic processor,
    the arithmetic processor executing:
        comparing current test codes for regions in a chip of a wafer with previous test codes for regions in a chip of a previous wafer, each of the current test codes being obtained by executing a plurality of types of electric tests by the tester for a corresponding region in the chip of the wafer, each of the previous test codes being obtained by previously executing the plurality of types of electric tests by the tester for a corresponding region in the chip of the previous wafer, the previous test codes indicating respective failure modes, the regions being smaller than each chip, and each chip including one of the semiconductor memories with memory cells arranged in a three-dimensional state;
        when a first test code of the current test codes is identical with one of the previous test codes, specifying a failure mode corresponding to the first test code from the failure modes;
        when the first test code of the current test codes is not identical with any of the previous test codes, generating first code distribution information that includes in-wafer and in-chip three-dimensional distributions, for the first test code;
        determining whether the first test code is labeled by using the first code distribution information;
        determining whether the first code distribution information is identical with second code distribution information, when the first test code is labeled by using the first code distribution information, the second code distribution information including in-wafer and in-chip three-dimensional distributions for the previous test codes;

when the first code distribution information is identical with the second code distribution information for one of the previous test codes, determining whether the first test code satisfies a classification minimum requirement of the identical previous test code; and presenting a content of electric failure analysis (EFA) measurement that assumes a failure mode corresponding to the previous test code among the failure modes, when the first code distribution information is identical with the second code distribution information, and the first test code satisfies the classification minimum requirement of the previous test code.

2. The failure analyzing apparatus according to claim wherein the arithmetic processor further executes:

picking out test codes having a classification minimum requirement satisfied by the test code, when labeling of the second code distribution information is not performable;

generating combined second code distribution information by stacking, in a time direction, combinations of second code distribution information of all the test codes thus picked out as a combined second code distribution information; and determining whether labeling of the combined second code distribution information is performable, wherein, in the determining whether the second code distribution information is identical with the first code distribution information, the arithmetic processor further executes determining whether the combined second code distribution information is identical with the first code distribution information, when labeling of the combined second code distribution information is performable, and in the presenting of the content of ETA measurement, the arithmetic processor executes presenting a content of EFA measurement that assumes a failure mode corresponding to the first code distribution information, when the combined second code distribution information is identical with the first code distribution information.

3. The failure analyzing apparatus according to claim 2, wherein in the determining whether the second code distribution information is identical with first code distribution information, the arithmetic processor further executes determining whether a matching rate of the combined second code distribution information with the first code distribution information is higher than a predetermined value, when the combined second code distribution information agrees to the first code distribution information, and in the presenting of the content of EFA measurement, the arithmetic processor executes presenting the content of EFA measurement, when the matching rate of the combined second code distribution information with the first code distribution information is higher than the predetermined value.

4. The failure analyzing apparatus according to claim 2, further comprising a first memory that stores production management information for managing a state of each wafer in production steps in units of a lot, wherein, when it is determined that the combined second code distribution information is identical with the first code distribution information, and further when a lot to which the wafer corresponding to the combined second code distribution information belongs is present in a test step, the arithmetic processor executes giving an EFA measurement execution flag to a record corresponding to the lot in the production management information, and the arithmetic processor executes presenting, in addition to the content of EFA measurement, a wafer with the EFA measurement execution flag attached thereto in the production management information, as a sample to be used.

5. The failure analyzing apparatus according to claim 4, wherein the arithmetic processor executes monitoring an EFA object label and its occurrence frequency, when no lot to be subjected to EFA is present in the test step.

6. The failure analyzing apparatus according to claim further comprising a first memory that stores production management information for managing a state of each wafer in production steps in units of a lot, wherein, when it is determined that the second code distribution information is identical with the first code distribution information, and the second code distribution information satisfies the classification minimum requirement of the first code distribution information, and further when a lot to which the wafer corresponding to the second code distribution information belongs is present in a test step, the arithmetic processor executes giving an EFA measurement execution flag to a record corresponding to the lot in the production management information, and the arithmetic processor executes presenting, in addition to the content of EFA measurement, a wafer with the EFA measurement execution flag attached thereto in the production management information, as a sample to be used.

7. The failure analyzing apparatus according to claim 6, wherein the arithmetic processor executes monitoring an EFA object label and its occurrence frequency, when no lot to be subjected to EFA is present in the test step.

8. The failure analyzing apparatus according to claim 1, wherein a unit of the region smaller than the chip is a block serving as a unit for erasing in the chip.

9. The failure analyzing apparatus according to claim 8, wherein a unit of the region smaller than the chip is the block, and a column formed by bundling a predetermined number of bit lines connecting a plurality of blocks arrayed in a predetermined direction.

10. The failure analyzing apparatus according to claim 1, further comprising a second memory that stores failure mode specifying information in which the failure mode and the first code are correlated with each other, wherein the arithmetic processor further executes generating the first code distribution information from the failure mode specifying information.

11. A failure analyzing method for a failure analyzing system comprising:

a tester performing an electric test on a semiconductor memory and to output each of measurement results as respective test codes;

a failure analyzing apparatus to receive the test codes from the tester;

an electric failure analysis (EFA) apparatus receiving EFA content from the failure analyzing apparatus and outputting a EFA measurement result to the failure analyzing apparatus;

the failure analyzing method comprising:

comparing current test codes for regions in a chip of a wafer with previous test codes for regions in a chip of a previous wafer, each of the current test codes being obtained by executing a plurality of types of electric tests by the tester for a corresponding region in the chip of the wafer, each of the previous test codes being obtained by previously executing the plurality of types of electric tests by the tester for a corresponding region in the chip of the previous wafer, the previous test codes indicating respective failure modes, the regions being smaller than each chip, and each chip including one of the semiconductor memories with memory cells arranged in a three-dimensional state;

when a first test code of the current test codes is identical with one of the previous test codes, specifying a failure mode corresponding to the first test code from the failure modes;

when the first test code of the current test codes is not identical with any of the previous test codes, generating first code distribution information that includes in-wafer and in-chip three-dimensional distributions, for the first test code;

determining whether the first test code is labeled by using the first code distribution information;

determining whether the first code distribution information is identical with second code distribution information, when the first test code is labeled by using the first code distribution information, the second code distribution information including in-wafer and in-chip three-dimensional distributions for the previous test codes;

when the first code distribution information is identical with the second code distribution information for one of the previous test codes, determining whether the first test code satisfies a classification minimum requirement of the identical previous test code; and presenting a content of electric failure analysis (EFA) measurement that assumes a failure mode corresponding to the previous test code among the failure modes, when the first code distribution information is identical with the second code distribution information, and the first test code satisfies the classification minimum requirement of the previous test code.

12. The failure analyzing method according to claim 11, further comprising:

picking out test codes having a classification minimum requirement satisfied by the first test code, when labeling of the second code distribution information is not performable;

generating combined second code distribution information by stacking, in a time direction, combinations of second code distribution information of all the test codes thus picked out as a combined second code distribution information; and determining whether labeling of the combined second code distribution information is performable, wherein, in the determining whether the second code distribution information is identical with first code distribution information, the method further comprises determining whether the combined second code distribution information is identical with first code distribution information containing in-wafer and in-chip three-dimensional distributions for the first code distribution information, when labeling of the combined second code distribution information is performable, and in the presenting of the content of EFA measurement, the method comprises presenting a content of EFA measurement that assumes a failure mode corresponding to the first code distribution information, when the combined second code distribution information is identical with the first code distribution information.

13. The failure analyzing method according to claim 12, wherein in the determining whether the second code distribution information is identical with first code distribution information, the method further comprises determining whether a matching rate of the combined second code distribution information with the first code distribution information is higher than a predetermined value, when the combined second code distribution information is identical with the first code distribution information, in the presenting of the content of EFA measurement, the method comprises presenting the content of EFA measurement, when the matching rate of the combined second code distribution information with the first code distribution information is higher than the predetermined value.

14. The failure analyzing method according to claim 12, wherein, when it is determined that the combined second code distribution information is identical with the first code distribution information in the determining whether the second code distribution information is identical with first code distribution information, and further when a lot to which the wafer corresponding to the combined second code distribution information belongs is present in a test step, the method further comprises giving an EFA measurement execution flag to a record corresponding to the lot in production management information, which is information for managing a state of each wafer in production steps in units of a lot, and in the presenting a content of EFA measurement, the method comprises presenting, in addition to the content of EFA measurement, a wafer with the EFA measurement execution flag attached thereto in the production management information, as a sample to be used.

15. The failure analyzing method according to claim 14, wherein, in the giving an EFA measurement execution flag, the method comprises monitoring an EFA object label and its occurrence frequency, when no lot to be subjected to EFA is present in the test step.

16. The failure analyzing method according to claim 11, wherein, when it is determined that the second code distribution information is identical with the first code distribution information in the determining whether the second code distribution information is identical with first code distribution information, and the second code distribution information satisfies the classification minimum requirement of the first code distribution information, and further when a lot to which the wafer corresponding to the second code distribution information belongs is present in a test step, the method further comprises giving an EFA measurement execution flag to a record corresponding to the lot in production management information, which is information for managing a state of each water in production steps in units of a lot, and in the presenting of the content of EFA measurement, the method comprises presenting, in addition to the content of EFA measurement, a wafer with the EFA measurement execution flag attached thereto in the production management information, as a sample to be used.

17. The failure analyzing method according to claim 16, wherein, in the giving an EFA measurement execution flag, the method comprises monitoring an EFA object label and its occurrence frequency, when no lot to be subjected to EFA is present in the test step.

18. The failure analyzing method according to claim 11, wherein a unit of the region smaller than the chip is a block serving as a unit for erasing in the chip.

19. The failure analyzing method according to claim 18, wherein a unit of the region smaller than the chip is the block, and a column formed by bundling a predetermined number of bit lines connecting a plurality of blocks arrayed in a predetermined direction.

20. The failure analyzing method according to claim 11, further comprising generating the first code distribution information from failure mode specifying information in which the failure mode and the first code are correlated with each other.

* * * * *